(12) United States Patent
King et al.

(10) Patent No.: US 6,529,019 B1
(45) Date of Patent: Mar. 4, 2003

(54) MULTIPLE AXIS MAGNETIC TEST FOR OPEN INTEGRATED CIRCUIT PINS

(75) Inventors: Philip N King, Ft Collins, CO (US); David T Crook, Loveland, CO (US); John Elliott McDermid, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 39 days.

(21) Appl. No.: 09/694,600

(22) Filed: Oct. 23, 2000

(51) Int. Cl.[7] .............................................. G01R 31/26
(52) U.S. Cl. ...................................................... 324/750
(58) Field of Search ................................ 324/247, 263, 324/529, 750, 751, 538, 530, 512, 522, 765

(56) References Cited

U.S. PATENT DOCUMENTS

| | | | |
|---|---|---|---|
| 4,109,199 A | * 8/1978 | Ball et al. | 324/247 |
| 4,186,338 A | * 1/1980 | Fichtenbaum | 324/529 |
| 4,742,356 A | * 5/1988 | Kulpers | 324/247 |
| 5,124,660 A | 6/1992 | Cilingiroglu | 324/538 |
| 5,254,953 A | 10/1993 | Crook et al. | 324/538 |
| 5,557,209 A | 9/1996 | Crook et al. | 324/537 |
| 5,625,292 A | 4/1997 | Crook et al. | 324/538 |
| 5,631,572 A | 5/1997 | Sheen et al. | 324/754 |
| 5,696,651 A | 12/1997 | Endo et al. | 360/104 |
| 6,281,697 B1 | * 8/2001 | Masuda et al. | 324/765 |

* cited by examiner

Primary Examiner—Vinh P. Nguyen

(57) ABSTRACT

The present disclosure relates to a method and apparatus for determining the electrical continuity of an element of an electrical component, for example, a pin of a printed circuit assembly. The method comprises the steps of supplying an electrical stimulus to the element of the electrical component, positioning a sensor adjacent the element of the electrical component, the sensor having multiple axes along which the sensor is responsive to magnetic fields, receiving magnetic field signals created by the element of the electrical component with the sensor, producing electrical signals indicative of the magnetic field strength sensed by the sensor in multiple directions that correspond to the multiple axes, and comparing the electrical signals with predetermined limits associated with the element being tested. In a preferred arrangement, the sensor is provided with three axes which are oriented in orthogonal directions such that the magnetic signals from the element can be detected in three dimensional space.

12 Claims, 7 Drawing Sheets

MULTIPLE AXIS MAGNETIC TEST FOR OPEN INTEGRATED CIRCUIT PINS

BACKGROUND OF THE INVENTION

As electronic printed circuit assemblies (PCA's) become more complex, it becomes increasingly difficult for traditional methods to verify their performance and to discover which part or parts are defective. This difficulty has led to extensive automated testing of PCA's, among the strategies of which are tests to verify the integrity of the solder joints and compression joints that electrically connect (and often mechanically attach) the various components to the PCA, including integrated circuits (IC's). This is particularly important when dealing with large surface mount components having ball grid arrays (BGA's), both at the time of initial manufacture and subsequent to a repair. Such BGA parts might be soldered to a matching land grid array (LGA), or held in place by a back-up plate that also squeezes the parts against the LGA through an intervening fuzzy wire ball BGA "socket." Testing is also important for IC's that have other styles of attachment such as "J" lead and a gull wing for surface mount applications, and rod-like or bar-like pins that extend from the package and whose distal ends are either soldered into through holes in the PCA or are pressed into the recess of a socket.

In the present disclosure, the term "pin" is used generically to refer to any exposed IC terminal that is connected to a PCA through any of the methods described herein. Accordingly, this term is intended to encompass "pins," the rods or tapered straps predominantly associated with earlier package styles, as well as terminals configured as bumps or lands. The term "external continuity" is used herein to describe electrical conductivity between an IC pin and the PCA.

Several methods are currently used to verify the external continuity of an electrical connection between a pad or land on a PCA and a pin on an IC. In one such method, the PCA is first mounted in a test fixture which registers it in a known manner upon a test apparatus. A bed of nails or a moveable test probe is brought into contact with traces on the PCA. A computer then controls testing of the individual connections on the PCA by, for example, closing switches of a matrix of relays associated with the bed of nails, or moving the test probe from point to point. During this testing, stimulus is applied to the PCA and measurements are taken. Unfortunately, this procedure tends to provide an unreliable indication of actual continuity between the IC pin of interest and the point of stimulus due to the existence of other paths in the surrounding circuitry.

In another method, electric fields emitted by the PCA are sensed with a capacitive probe whose location is also controlled to match the test being performed. Although capacitive probes often function satisfactorily, they can be rendered useless by internal shielding that may be incorporated into the IC by its manufacturer.

In yet another method, a magnetic field created by current flowing through the pin of interest is sensed. Such measurement of a magnetic field is usually possible, even while ignoring the particular functional circuitry contained in the IC to cooperate with that pin, since there are usually protection diodes connected from each pin to GND and/or to VCC. Although a DC signal can be used as a stimulus, AC signals are often preferred, since: (a) they are easily sensed, often simply with a coil of wire inductively coupled to the resulting magnetic field; (b) they are easier to identify or distinguish a signal of known frequency and phase in an electrically noisy environment; and (c) the magnetic field for low level DC signals can be obscured by external, environmental, or the earth's magnetic fields. In any event, external biasing of the IC's protection diodes or simply accepting rectification produced by those diodes will permit a steady or pulsating current to flow, either of which produces a magnetic field detectable by an appropriate sensor positioned proximate the IC. This kind of a system has the additional advantage of testing internal continuity as part of the test for external continuity.

A pulsating system of the sort described above is disclosed in U.S. Pat. No. 5,399,975 issued to Laing, et al. The system described therein can however render inaccurate readings due to conductors on the PCA connected to the pin being probed. In particular, current flowing in the conductor can produce a collateral magnetic field that masks an absence of the magnetic field from the IC, resulting in an undetected open circuit. Alternatively, a false failure indication can occur which can result in indictment of a fully operable component.

In a system described in U.S. Pat. No. 5,631,572 issued to Sheen et al., a spiral antenna is positioned above the IC to induce a current in a conductive closed loop path formed by probes that probe the IC, the protection diodes inside the IC, and the external current measurement circuitry connecting the probes. The antenna is positioned in close proximity to the IC to ensure good coupling. When the spiral antenna is centered over a conductor of the IC, the current flowing through the conductor can induce a current, in accordance with Lenz's law, that flows in an opposite, parallel direction. This opposing flow causes the currents in the conductor to sum to zero. This phenomenon creates a false open which can skew test results.

From the foregoing discussion it can be understood that there is a need for an improved method of magnetic sensing to provide a better complement to the capacitive method. In particular, it would be desirable to have a magnetic method for checking both internal and external continuity whose reliability is largely unaffected by conductors near the part under test, regardless of their orientation, and that produces a meaningful and usable indication despite influence from other magnetic fields.

SUMMARY OF THE INVENTION

The present disclosure relates to a method for determining the electrical continuity for an element of an electrical component, for example, a pin of a printed circuit assembly. The method comprises the steps of supplying an electrical stimulus to the element of the electrical component, positioning a sensor adjacent the element of the electrical component, the sensor having multiple axes along which the sensor is responsive to magnetic fields, receiving magnetic field signals created by the element of the electrical component with the sensor, producing electrical signals indicative of the magnetic field strength sensed by the sensor in multiple directions that correspond to the multiple axes, and comparing the electrical signals with predetermined limits associated with the element being tested. In a preferred arrangement, the sensor is provided with three axes which are oriented in orthogonal directions such that the magnetic signals from the element can be detected in three dimensional space.

The present disclosure also relates to an apparatus for testing the continuity between an element of an electrical component. The apparatus comprises a stimulus system electrically adapted to be coupled to the element of the electrical component, a first sensor oriented along a first axis and inductively coupled to the stimulus system, a second sensor oriented along a second axis and inductively coupled to the stimulus system, a first signal measurement circuit coupled to the first sensor, a second signal measurement circuit coupled to the second sensor, and a comparison circuit coupled to the first and second signal measurement circuits which indicates whether signals induced in the first and second sensors are within predetermined limits. In a preferred arrangement, the apparatus is provided with three sensors which are oriented in orthogonal directions such that the magnetic signals from the element can be detected with the apparatus in three dimensional space.

The features and advantages of the invention will become apparent upon reading the following specification, when taken in conjunction with the accompanying drawings.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DESCRIPTION OF A PREFERRED EMBODIMENT

Figure 1:
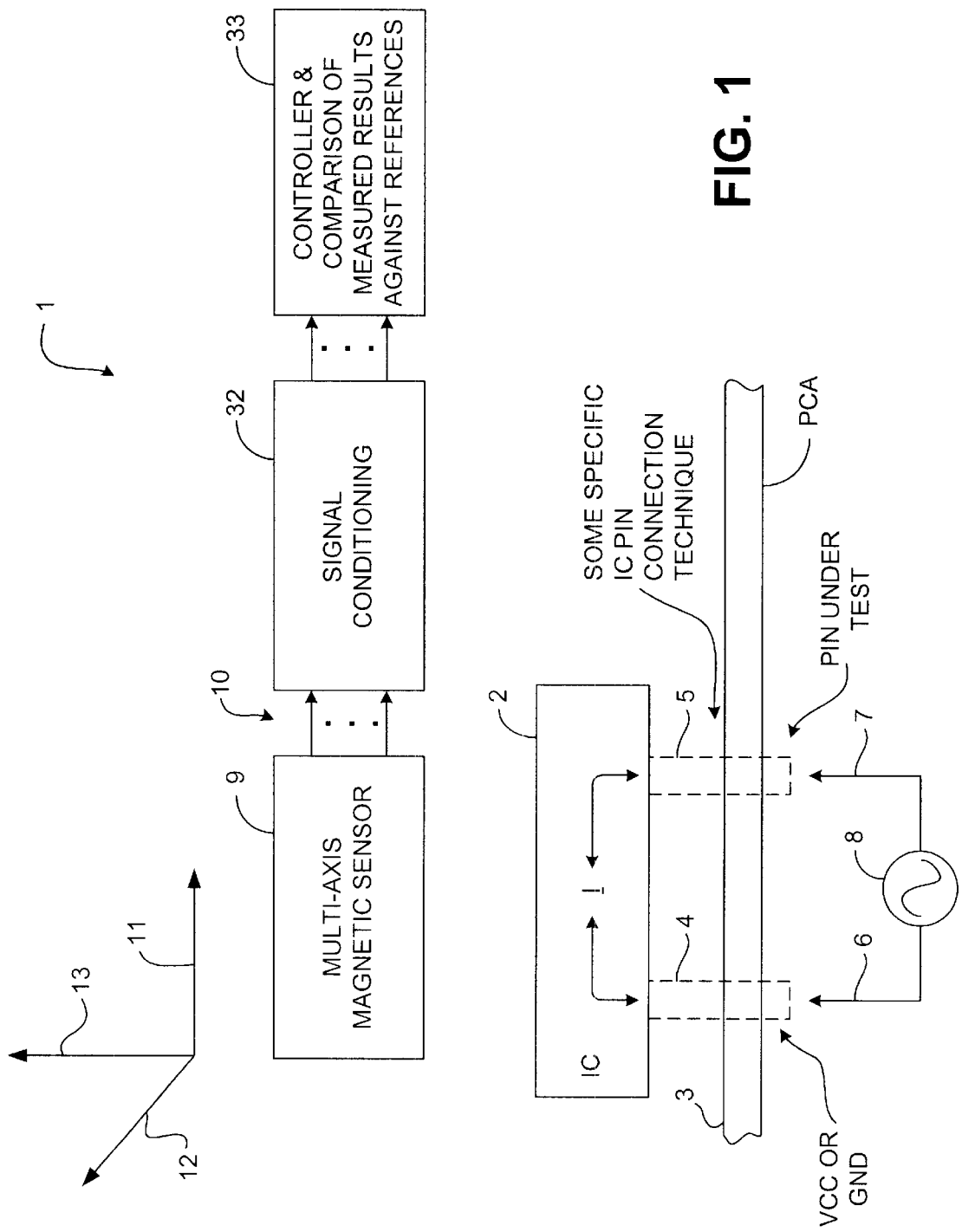
FIG. 1 is a block diagram of a test system that uses multi-axis magnetic sensing to determine whether an IC pin under test is open.

Referring now to the figures in which like numerals identify corresponding parts, FIG. 1 illustrates a simplified block diagram of a system 1 for testing an IC 2 for open circuited pins. The IC 2 is mounted on or affixed to a PCA 3. The PCA 3 is held in a suitable test fixture (not shown), which may be conventional in design. Pin 4 (for either VCC or GND) and pin 5 (the pin under test) are depicted in an abstract manner which will be understood to represent any of the usual electrical connection techniques employed between an IC and a PCA. For purposes of discussion, the pins will be assumed to represent dowel shaped pins passing through and soldered to a plated through hole, tapered flat pins in a through hole or in a compressive receptacle of a socket, "bumps" in a BGA socketed or soldered to an LGA of plated through holes, or surface mount J-leads or gull wing leads soldered to lands that are part of a trace which can be electrically contacted by a probe.

As shown in FIG. 1, pins 4 and 5 are contacted by probes 6 and 7, respectively, which are also depicted as being on the side of the PCA 3 opposite the IC 2. However, the side of the PCA which is contacted by the probes will be a function of convenience and the configuration of the test fixture in which the PCA 3 is mounted. Probes 6 and 7 may be members of a larger "bed of nails," or may be individually positionable probes. It is to be understood that, because many PCA's have IC's mounted on both sides, the arrangement shown in FIG. 1 is merely representative. In particular, the figure should not be interpreted as requiring the IC to be on the top of and the probes on the bottom of the PCA.

Probes 6 and 7 are electrically connected to a stimulus signal generator 8. Although not depicted, the system 1 can include a bias network that may be used to cause current or voltage to flow through pins 4 and 5 and the IC 2 when probes 6 and 7 make contact with pins 4 and 5. This flow can be connected to the IC, for example, through a series resistor (not shown). Although depicted as an AC generator, a DC generator, or one producing a complex waveform having both AC and DC components, may alternatively be used as well.

Positioned above the IC 2 is a multi-axis magnetic sensor 9. In a large automatic test system, the multi-axis magnetic sensor can be moved into position by a computer controlled robotic mechanism (not shown). Alternatively, there could be a second test fixture that is specific to the PCA 3 and that has a plurality of multi-axis magnetic sensors already disposed thereon in locations that are sufficiently proximate to the various IC's to be tested when the fixture is brought into registration with the PCA.

Each multi-axis magnetic sensor 9 typically comprises an assembly that contains a plurality of individual single axis magnetic sensors (see FIG. 2), each having an axis that, when aligned with an applied magnetic field, maximizes the electrical response from that individual sensor. The multi-axis magnetic sensor 9 may, for example, contain two or three individual single axis magnetic sensors whose axes are orthogonal. Accordingly, an X axis 11 and a Y axis 12 can be defined that together form an XY plane which is generally parallel to the top surface of the IC 2. Furthermore, a Z axis 13 can be defined that is perpendicular to the XY plane. The multi-axis magnetic sensor 9 may have internal magnetic axes that are aligned with these X, Y, and Z axes. Although such alignment is preferred, it will be understood that such alignment is not necessary. Instead, the multi-axis magnetic sensor 9 could be arbitrarily oriented with respect to the PCA and the IC thereon to be tested.

While repeatability for the positioning of the multi-axis magnetic sensor 9 is desirable from test to test, is in not necessary for the multi-axis magnetic sensor to be positioned in any particular orientation for any particular test. Accordingly, multi-axis magnetic sensor 9 need not be centered directly above or opposite the pin under test. As will be understood by those having skill in the art, different locations for the multi-axis magnetic sensor 9 will yield different measured components for a given stimulus to the pin under test. However, the notion that one position and its associated set of measured values is "correct," and that the others are all mere approximations or degraded instances of the "correct" value, is not accurate per se in view of the fact that the magnetic field being measured is not emanating from a point source. Instead, there is an entire path within the IC, including at least two bonding wires (or their equivalent) and interconnecting circuitry. Therefore, the source of the magnetic field has a definite size, and the magnetic sensors have apertures related to their coil diameter or other size. Some positions of the multi-axis sensor 9 will produce better coupling and more signal than others for a given pin under test, but there may be many other positions that are equally useful as the chosen location.

Extending from the multi-axis magnetic sensor 9 in FIG. 1 are outputs 10. These outputs 10 represent the magnitudes of the signals produced by the various individual single axis magnetic sensors within the multi-axis magnetic sensor 9. Preferably, the outputs 10 are coupled to signal conditioning circuitry 32 (e.g., amplification, filtering, etc.) and to a controller 33 for comparison against reference results obtained in advance from one or more known non-defective assemblies. The comparison between the two produces a determination as to the integrity of the internal and external continuity of the pin 4 or 5. Typically, the controller 33 further determines the location on the PCA as it receives the stimulus and makes the determination concerning continuity.

Figure 2:
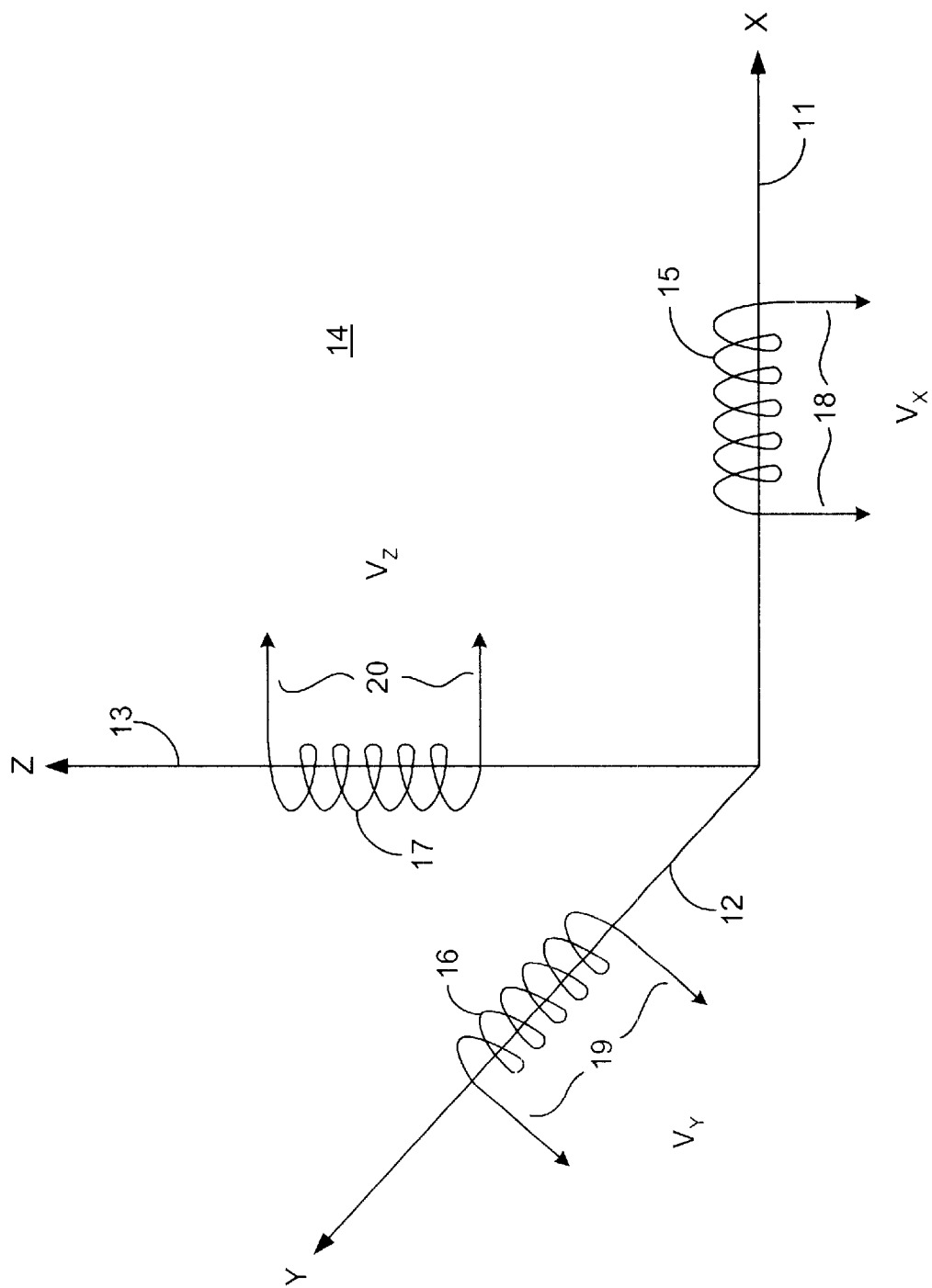
FIG. 2 is a schematic diagram of an arrangement of inductive pick-ups that may be used as a multi-axis magnetic sensor in the system of FIG. 1.

Referring now to FIG. 2, shown in schematic form is an example arrangement 14 of individual single axis magnetic sensors 15–17 usable in combination as a multi-axis magnetic sensor 9. In this example, three individual single axis magnetic sensors 15, 16, and 17 are orthogonally disposed in alignment with axes 11, 12, and 13, respectively. These sensors 15–17 can comprise coils of wire that produce respective output signals 18–20 by magnetic induction in response to their presence in a changing magnetic field. As will be appreciated by persons of skill in the art, the sensors 15–17 respond best when the magnetic variations occur along the axis, but also respond, with gradually degrading strength for off axis conditions, approaching zero response when the off axis condition is perpendicularity.

In that inductive coupling between the stimulated IC and conductive coils is preferred, the individual magnetic sensors 15–17 do not produce an output except in the case of relative physical motion between the sensors and the magnetic field, or in response to an expanding or contracting magnetic field. The output signals 18–20 produced therefore will be AC signals. While this arrangement has certain advantages, for example, immunity to steady state environmental conditions, easily obtained gain, and generally easy discrimination against spurious signals, other methods of coupling can be used. For instance, Hall effect sensors, while more complicated, can provide DC sensing of the magnetic field produced by DC stimulation of the IC under test 2. Hall effect sensors also can be used to sense an AC magnetic field, or the two combined, if desired. In addition, the sensors 15–17 can comprise magneto-resistive sensors of known construction, or substantially any other known sensing device capable of sensing magnetic fields generated by the pin under test.

As is apparent from the foregoing, an arrangement comprising three orthogonal axes is preferred. Such an arrangement is deemed preferable for several reasons. First, the existence of other normal conditions may mask the absence of some other effect being tested for, resulting in an open pin remaining undetected or a non-defective pin being detected as faulty. For example, when two signals of opposite sign are being summed, the net reading may be zero even though a strong signal exists for the particular pin being tested. Alternatively, if a signal is being transmitted in the z direction but sensing is only conducted in the x-y plane, the signal can be missed, again resulting in an incorrect reading. By adding additional axes to the measurement of the magnetic field, however, the amount of information available about the circumstances of the part under test is increased and the criteria for declaring the part acceptable is narrowed. The three axis orientation is also preferred because it matches the actual conditions surrounding the IC and preserves a one-to-one mapping from the results of the stimulus (the magnetic field) and its measured indications. By using three axes, ambiguities otherwise caused by ignoring an axis can be reduced or eliminated. Orthogonal axes are most preferred because such a configuration avoids the need to translate from one coordinate system to another, and permits one-to-one mapping issue described above.

Figure 3A:
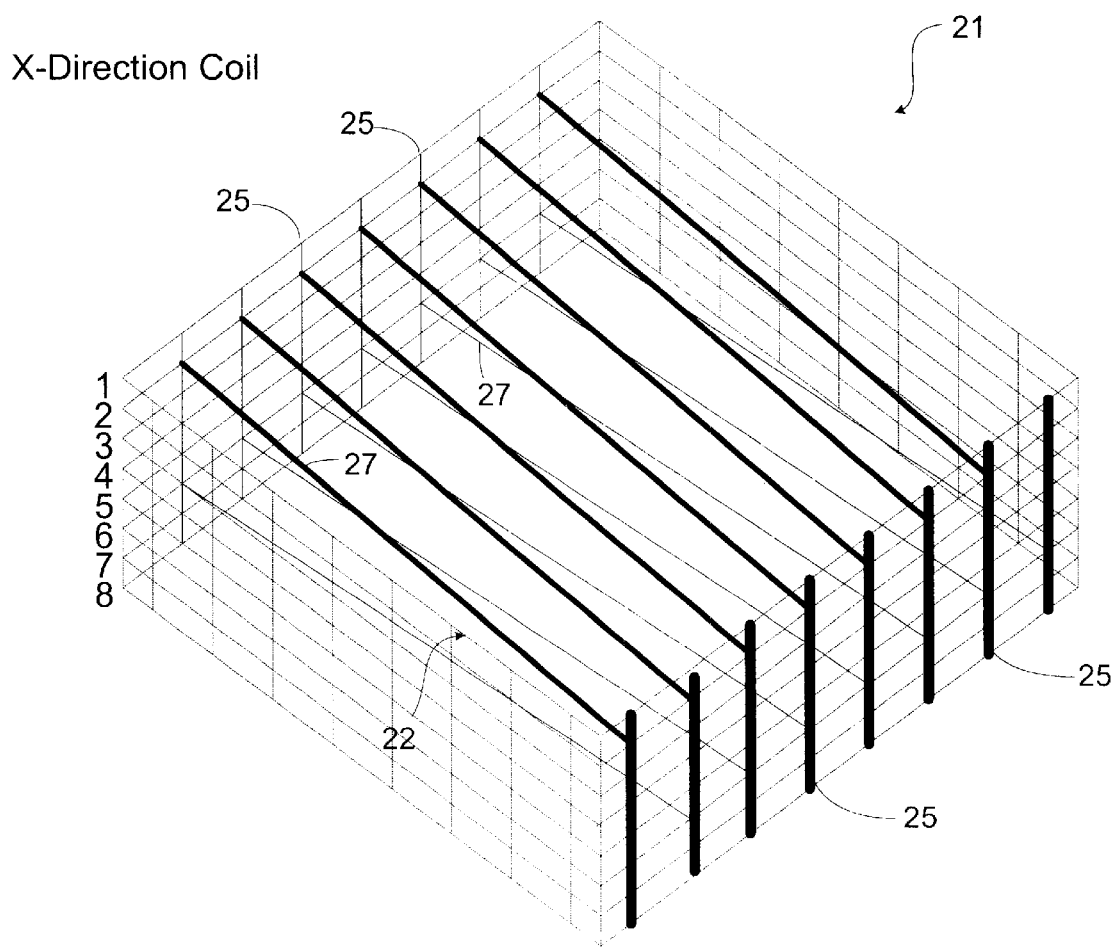
FIGS. 3A–3D are schematic diagrams illustrating how the inductive pick-up arrangement of FIG. 2 can be constructed as a multi-layer printed circuit board.
Figure 3B:
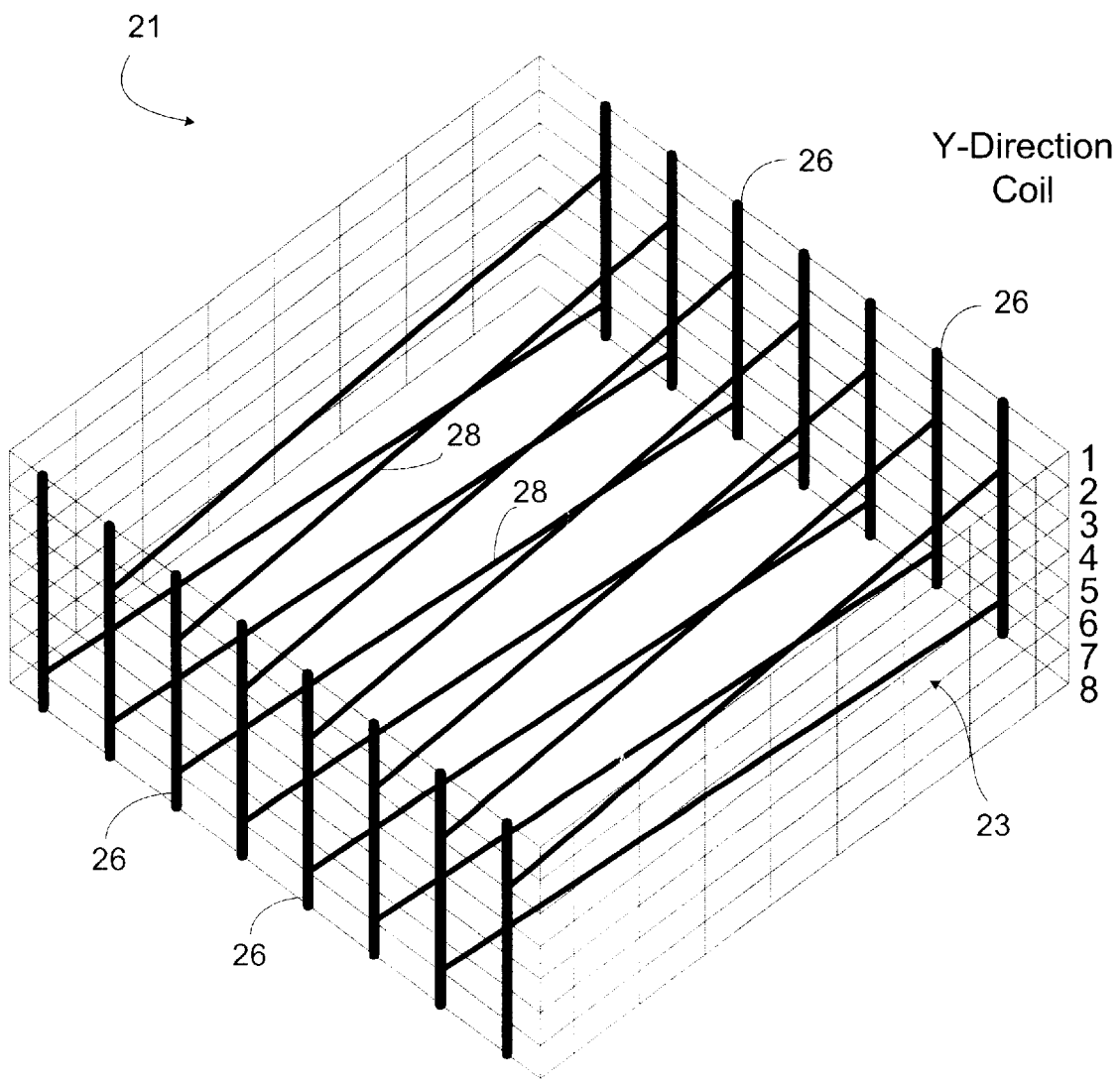
Figure 3C:
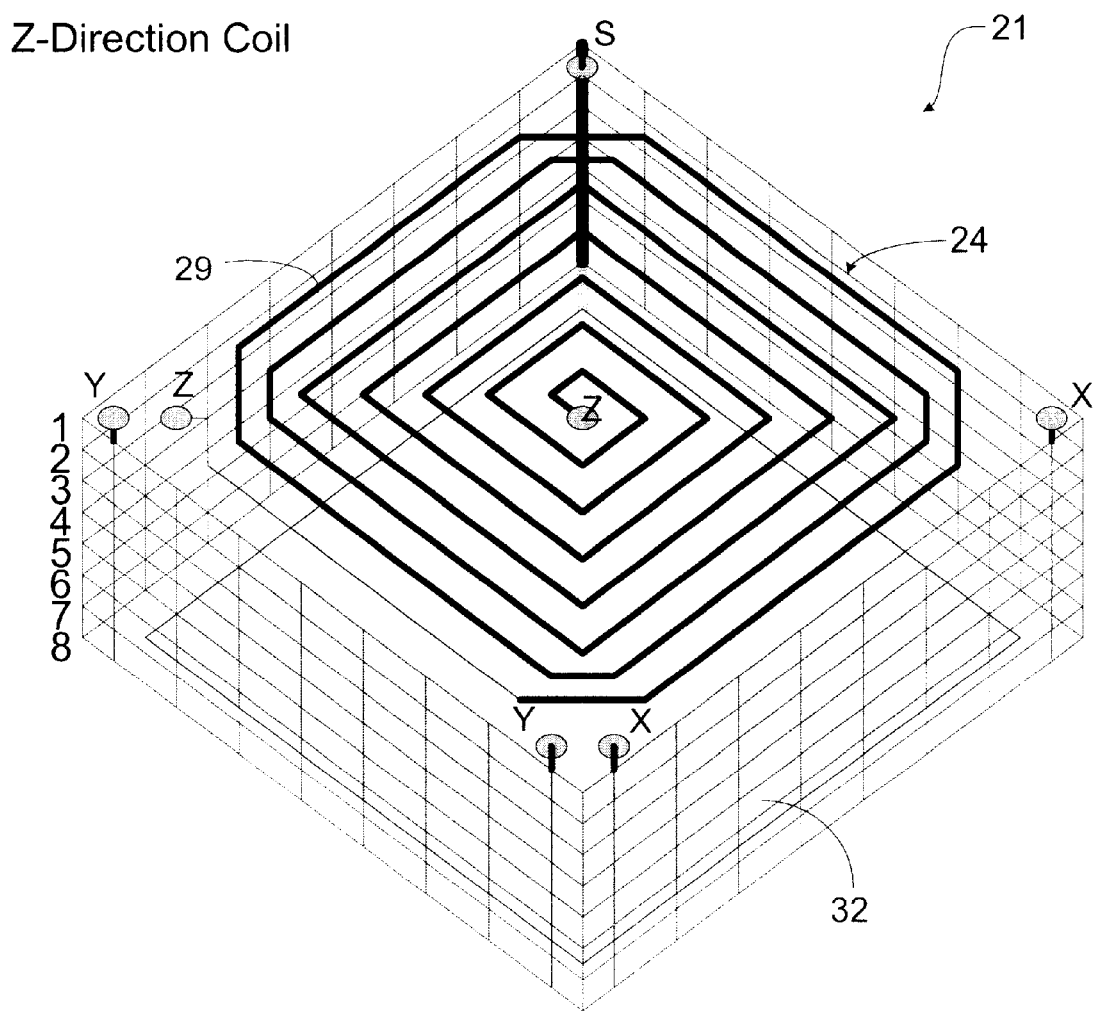
Figure 3D:
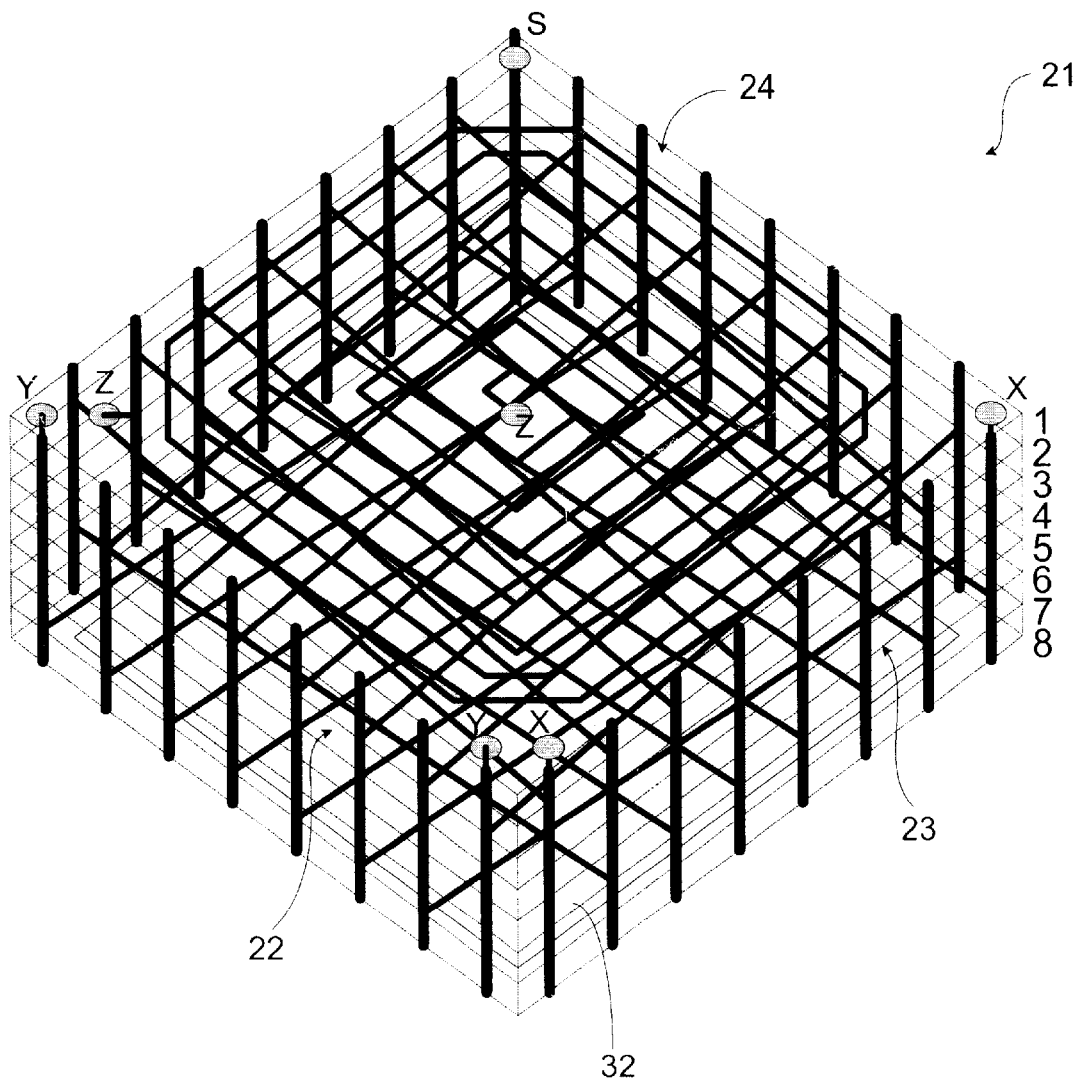

Referring now to FIGS. 3A–3D, shown are schematic representations of a preferred multi-axis magnetic sensor that is configured as a printed circuit board 21. The printed circuit board 21 comprises three sets of windings, each set being wound around an axis that is orthogonal to the other two. FIGS. 3A, 3B, and 3C individually show schematic representations of the X-direction coil 22, the Y-direction coil 23, and the Z-direction coil 24, while FIG. 3D shows each of these coils concurrently (i.e., the complete arrangement). As indicated in the figures, the printed circuit board 21 can have, for instance, eight separate layers, each of the layers being labeled in FIGS. 3A–3D. Extending through each of the layers are a plurality of vias. In particular, there are opposed vias 25 for the X-direction coil 22 (FIG. 3A) as well as opposed vias 26 for the Y-direction coil 23 (FIG. 3B). These vias 25, 26 form the "vertical" (in terms of FIGS. 3A and 3B) portions of these coils. To complete the coils 22 and 23, a plurality of diagonal traces 27, 28 are formed at predetermined layers of the printed circuit board 21. By way of example, the traces 27 associated with the X-direction coil 22 can be formed in layers 2 and 6 in the manner depicted in FIG. 3A so as to connect the vias 25 arranged on opposite sides of the printed circuit board 21 to form a continuous electrical loop. Similarly, the traces 28 associated with the Y-direction coil 23 can be formed in layers 3 and 7 in the manner depicted in FIG. 3B so as to connect the vias 26 arranged on opposite sides of the printed circuit board 21. Turning to FIG. 3C, the Z-direction coil 24 can be constructed by forming a continuous trace 29 in the shape of a spiral. This trace 29 can be formed in a single layer, for example, layer 1 (i.e., the top layer). FIG. 3D shows each orthogonal coil 22–24 of the printed circuit board 21.

In addition to these coils 22–24, the printed circuit board 21 can include one or more shield layers 32 (FIGS. 3C and 3D) that serve to prevent or minimize capacitive coupling from the device under test to the coils (or to other magnetic sensors) that comprise the multi-axis magnetic sensor. The result is a collection of orthogonal coils which, by way of example, can each have approximately thirty-five or forty turns. The preferred frequency of the generator 8 (in FIG. 1) is in the range of five to ten kilohertz, although the frequency could be considerably higher (in the megahertz region) without encountering technical difficulties. It will be appreciated that the size of and number of turns in any particular sensor can be varied according to either the size of the intended device being tested, or the ability of the available printed circuit technology to form closely spaced fine lines. Preferably, the X and Y dimensions of the multi-axis magnetic sensor 21 are such that they either approximately match the outline of the device under test, or are slightly smaller.

According to the present method, the three signals 18–20 can be interpreted as a vector. Accordingly, two variables, magnitude and direction, are observed as opposed to just amplitude as with conventional systems. Once the signals have been received, they are interpreted and/or analyzed to arrive at a determination as to whether open circuited pins exist. In the case of AC signals, it typically is sufficient to amplify the signals in a conventional manner by known amounts and measure the AC values, producing a vector defined by: $(V_x, V_y, V_z)$. Assuming that these signals arise from an AC magnetic field that is produced from a single sinusoidal current, each signal 18–20 has the same frequency and no extended mathematics are needed to combine the three components. Once this vector is determined, each of its components (the individual $V_x$, $V_y$ and $V_z$ values) is checked to ensure that it lies within a predetermined range established for the particular IC pin being tested. Although X, Y, Z coordinates are discussed herein, it will be appreciated that the use of other coordinate systems, such as polar, would work equally well in the present method.

Once the magnitude and phase of each sensor has been obtained with the apparatus, they can be processed to yield valuable information as to the status of the component being tested, e.g., whether a pin on the component is defective or properly formed. Several different methods can be used to obtain this information. In one such method a vector sum can be performed to yield the desired information. Alternatively, a root mean square (RMS) sum can be performed. By using this technique, the signal cancellation problem described in the foregoing can be avoided. As an alternative to performing an RMS sum, the signals from each sensor can be rectified using a precision rectifier circuit (not shown) and then summed. The resulting summed signal can be measured using an integrator which is gated over an integer number of cycles of the source signal. With this technique, as with the RMS method, signal cancellation is avoided, albeit through use of a relatively simple circuit as compared to that required for the RMS method.

The three vector components $V_x$, $V_y$ and $V_z$ are applied to voltmeters (not shown) after suitable amplification and possible filtering. For a given pin on a given IC, each measured component value is compared against stored preferred ranges for the values. The preferred ranges may be determined by testing a number of known non-defective assemblies and selecting suitable ranges with statistical methods based on observed variations. If each measured vector component of each pin is within the predetermined preferred range, then the PCA is deemed to be acceptable.

In addition to the existence of magnetic field strength for a particular pin, the shape of the sensed magnetic field also influences the test. The inquiry then is how the magnetic field strength varies as a function of distance and direction relative to the pin being tested. There are a number of ways that this can be determined. In one method a number of measurements separated by a relative repositioning between the multi-axis sensor and the PCA is made while keeping the pin stimulus constant. For example, if five measurements are taken, the first measurement can be designated a "center" measurement, with the next four being at different locations in the XY plane that may be described as being "left," "right," (along the X axis) and "forward" and "rearward". The relative repositioning can be produced either by moving the multi-axis sensor between measurements while the PCA remains still, or by moving the PCA while the multi-axis sensor remains still. The size of the steps may range from a fraction of the spacing between adjacent pins to a distance, discovered by prior inspection, which would ordinarily be expected to produce some significant amount of change in one or more of the measured components, e.g., by thirty or fifty percent.

In an alternative method, a small array of adjacent multi-axis sensors can be used to perform the pin testing. In such an arrangement, the sensors provide simultaneous sensing in each of the axes, at several locations as above, all for a single instance of stimulus for a given pin under test. If desired, the array can be relatively large such that it covers the entirety or a significant portion of the exposed XY surface of the integrated circuit of interest. With this arrangement all (or those corresponding to the significant portion) of the pins can be successively stimulated without having to move the array.

Figure 4:
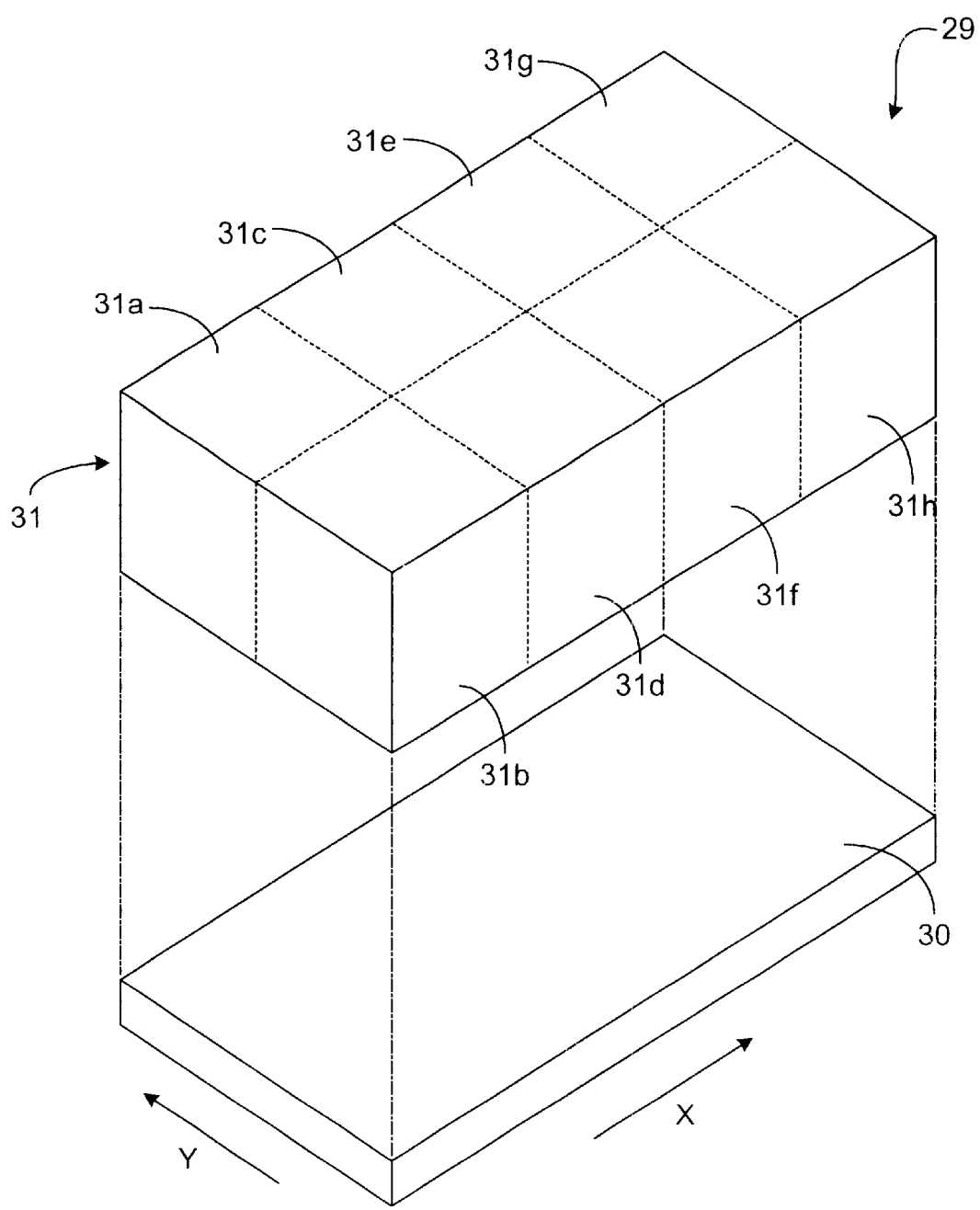
FIG. 4 is a diagram of an integrated circuit above which is positioned an array of multi-axis magnetic field sensors.

FIG. 4 illustrates an example of an IC 30 being tested with a large array of multi-axis sensors 31. As shown in the figure, the large array 31 has eight individual multi-axis sensors 31a–31h. Assuming each of the multi-axis sensors 31a–h has three axis sensors, twenty-four signals are made available from sensor array 31 for processing. As depicted, the sensor array 31 has a footprint that closely matches that of the IC 30, and is disposed essentially directly above it and aligned as if it were the projection of the IC.

In each of the methods described above, a plurality of vectors are obtained for each pin that is stimulated. Such an arrangement permits a large amount of data to be collected which translates into more data for the comparison. Therefore, greater accuracy can be obtained, avoiding a situation in which faulty components pass as acceptable and/or acceptable components fail as being faulty.

Although orthogonality has been identified herein as being preferred, it should be noted that useful results can be obtained without a true orthogonal configuration in that magnetic sensors tend to have "broad" response curves. Therefore, even with moderate non-orthogonality, measurements and comparisons made under repeatable conditions will produce reliable indications. In addition, although particular methods and apparatuses have been described herein, there are other sensing techniques that could be used as well, including those using Hall effect devices and the magneto-resistive effect. Nor is the stimulus signal limited to AC coupling of an audio signal; DC stimulus and stimulus with a genuine RF signal are feasible alternatives. Furthermore, although a printed circuit board is shown as described as comprising a preferred arrangement for the multi-axis sensor, it is to be understood that alternative arrangements are possible such as hybrid ceramic sensors in which each layer is silk-screened onto a substrate or thin film disposed on silicon as in integrated circuit fabrication.

While particular embodiments of the invention have been disclosed in detail in the foregoing description and drawings for purposes of example, it will be understood by those skilled in the art that variations and modifications thereof can be made without departing from the spirit and scope of the invention as set forth in the following claims.

We claim:

1. An apparatus for testing the continuity between an element of an electrical component, the apparatus comprising:

a stimulus signal generator configured to provide an electrical stimulus to the element such that an electrical signal is driven across the element;

a first and second magnetic sensor oriented along a first axis and a second axis, respectively, wherein each are configured to sense a magnetic field produced by the element, wherein the magnetic fields induce an electrical signal on each magnetic sensor; and a controller coupled to the sensors and configured to compare the induced electrical signals against reference signals to determine the integrity of the continuity of the element.

2. The apparatus of claim 1, wherein said first and second axes are substantially orthogonal to each other.

3. The apparatus of claim 1, wherein said first and second sensors comprise conductor windings.

4. The apparatus of claim 3, wherein said windings comprise traces on a multi-layer printed circuit board.

5. The apparatus of claim 1, wherein said first and second sensors comprise Hall effect sensors.

6. The apparatus of claim 1, wherein said first and second sensors comprise magneto resistive sensors.

7. The apparatus of claim 1, further comprising a third magnetic sensor oriented along a third axis, wherein said controller is coupled to each of said first, second, and third magnetic sensors.

8. The apparatus of claim 7, wherein said third sensor comprises a conductor winding.

9. The apparatus of claim 8, wherein said conductor winding of said third sensor comprises traces on a multi-layer printed circuit board.

10. The apparatus of claim 9, wherein said first and second sensors comprise Hall effect sensors.

11. The apparatus of claim 9, wherein said first and second sensors comprise magneto resistive sensors.

12. An apparatus for testing the continuity between an element of an electrical component, the apparatus comprising:

means for providing an electrical stimulus to the element such that an electrical signal is driven across the element;

first and second magnetic sensing means oriented along a first axis and a second axis, respectively, for sensing components of a magnetic field produced by the element, wherein the components of the magnetic fields induce an electrical signal on each of the magnetic sensing means; and means for comparing the induced electrical signals against reference signals to determine the integrity of the continuity of the element.

* * * * *